(12) United States Patent
Shindo

(10) Patent No.: US 8,523,138 B2
(45) Date of Patent: Sep. 3, 2013

(54) VACUUM PROCESSING APPARATUS

(75) Inventor: Takehiro Shindo, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 69 days.

(21) Appl. No.: 13/346,381

(22) Filed: Jan. 9, 2012

(65) Prior Publication Data

US 2012/0111668 A1    May 10, 2012

Related U.S. Application Data

(62) Division of application No. 12/552,946, filed on Sep. 2, 2009, now Pat. No. 8,113,487, which is a division of application No. 11/297,379, filed on Dec. 9, 2005, now Pat. No. 7,611,124.

(30) Foreign Application Priority Data

Dec. 22, 2004 (JP) ................................. 2004-371049

(51) Int. Cl.
*F16K 51/00* (2006.01)

(52) U.S. Cl.
USPC .............. 251/11; 251/355; 414/217; 414/935

(58) Field of Classification Search
USPC ................ 251/11, 355; 414/217, 217.1, 935; 184/9, 105.3, 105.1, 39.1, 6.14
See application file for complete search history.

(56) References Cited

U.S. PATENT DOCUMENTS

| 2,608,996 | A | * | 9/1952 | Forman ............................. 251/11 |
| 2,982,145 | A |  | 5/1961 | Orner |
| 4,153,140 | A |  | 5/1979 | Mahr et al. |
| 4,276,005 | A |  | 6/1981 | Bassan |
| 5,306,380 | A |  | 4/1994 | Hiroki |
| 5,374,147 | A |  | 12/1994 | Hiroki et al. |
| 5,618,409 | A | * | 4/1997 | Kreill ............................... 251/11 |
| 5,881,649 | A |  | 3/1999 | Hasegawa et al. |
| 5,971,696 | A |  | 10/1999 | Endo et al. |
| 6,082,899 | A |  | 7/2000 | Suzuki et al. |
| 6,123,457 | A |  | 9/2000 | Suzuki et al. |
| 6,244,811 | B1 |  | 6/2001 | Kroeker et al. |
| 6,261,048 | B1 |  | 7/2001 | Muka |
| 6,296,078 | B1 |  | 10/2001 | Liu |
| 6,450,295 | B1 |  | 9/2002 | Tsukada et al. |
| 6,459,947 | B1 |  | 10/2002 | Hirata et al. |
| 6,705,430 | B2 |  | 3/2004 | Michioka et al. |
| 6,880,676 | B2 |  | 4/2005 | Tsukada et al. |
| 2001/0014268 | A1 |  | 8/2001 | Bryson et al. |
| 2002/0134622 | A1 |  | 9/2002 | Michioka et al. |
| 2002/0197145 | A1 |  | 12/2002 | Yamamoto et al. |

(Continued)

FOREIGN PATENT DOCUMENTS

| JP | 56-28392 | 3/1981 |
| JP | 2-4099 | 1/1990 |

(Continued)

*Primary Examiner* — John Bastianelli

(74) *Attorney, Agent, or Firm* — Oblon, Spivak, McClelland, Maier & Neustadt, L.L.P.

(57) ABSTRACT

A grease supply mechanism is provided inside a vacuum transfer chamber. The grease supply mechanism includes: a grease storage part in a bottomed cylindrical shape storing grease therein; and a movable cover covering an opening of the grease storage part and sliding while being in contact with an inner wall of the grease storage part. When the cover is pressed and moved, the grease is supplied into a grease inlet via a grease supply port.

4 Claims, 5 Drawing Sheets

(56) References Cited

U.S. PATENT DOCUMENTS

2003/0053893 A1 3/2003 Matsunaga et al.
2003/0075386 A1 4/2003 Kimura
2003/0168173 A1 9/2003 Tamura
2004/0029740 A1 2/2004 Yatsushiro et al.

FOREIGN PATENT DOCUMENTS

| | | |
|---|---|---|
| JP | 4-177716 | 6/1992 |
| JP | 6-307458 | 11/1994 |
| JP | 8-11940 | 1/1996 |
| KR | 2000-0031965 | 6/2000 |
| KR | 2001-0106244 | 11/2001 |

* cited by examiner

VACUUM PROCESSING APPARATUS

CROSS-REFERENCE TO RELATED APPLICATION

This application is a division of U.S. application Ser. No. 12/552,946 filed Sep. 2, 2009, which is a division of U.S. application Ser. No. 11/297,379 filed Dec. 9, 2005 (now U.S. Pat. No. 7,611,124) and claims the benefit of priority from the prior Japanese Patent Application No. 2004-371049 filed on Dec. 22, 2004; the entire contents of each of which are incorporated herein by reference.

BACKGROUND OF THE INVENTION

1. Field of the Invention

The present invention relates to a vacuum processing apparatus in which the transfer of an object to be processed such as, for example, a semiconductor wafer and vacuum processing such as etching and film deposition are performed under a vacuum atmosphere.

2. Description of the Related Art

As a conventionally known vacuum processing apparatus, there is a vacuum processing apparatus which applies, under a vacuum atmosphere, vacuum processing such as, for example, etching and film deposition to an object to be processed such as, for example, a semiconductor wafer. As such a vacuum processing apparatus, also known is one in which a transfer mechanism is provided in a vacuum chamber (vacuum transfer chamber) and an object to be processed such as a semiconductor wafer is carried in this vacuum transfer chamber (see, for example, Japanese Patent Laid-open Application No. Hei 8-11940).

When the above-described vacuum processing apparatus includes, for example, a mechanically operating mechanism such as a transfer mechanism provided in the vacuum chamber, grease (vacuum grease) is sometimes applied as a lubricant to a slide mechanism part and the like of the transfer mechanism and the like provided in the vacuum chamber. In such a case, periodic resupply of the grease to the slide mechanism part and the like in the vacuum chamber is necessary. In the conventional vacuum apparatus, at the time of this grease resupply, the vacuum chamber is opened to the atmosphere and a worker injects the grease to a predetermined place by using a grease gun or the like.

However, the work of once opening the vacuum chamber, which has been set to the vacuum atmosphere, to the atmosphere and supplying the grease takes time and trouble. Moreover, it takes time to set the vacuum chamber, which is once opened to the atmosphere, to the vacuum atmosphere again so as to allow the resumption of the vacuum processing. This has a problem of lowering the operating rate of the vacuum processing apparatus to worsen productivity.

Another problem is that the maintenance of the grease supply may possibly be forgotten and a sliding operation with insufficient grease is continued for a long period of time, which may possibly give a bad effect to the vacuum processing apparatus.

SUMMARY OF THE INVENTION

It is an object of the present invention to provide a vacuum processing apparatus in which grease can be supplied to a predetermined place without opening a vacuum chamber to the atmosphere, thereby improving the operating rate of the vacuum processing apparatus to achieve improved productivity, and in which the maintenance of the grease supply can be performed without fail.

A vacuum processing apparatus according to an aspect of the present invention is a vacuum processing apparatus applying vacuum processing to an object to be processed under a vacuum atmosphere, the apparatus including: a vacuum chamber; and a grease supply mechanism provided in the vacuum chamber to supply grease to a slide mechanism sliding in the vacuum chamber.

According to one embodiment of the vacuum processing apparatus of the present invention, the vacuum processing apparatus further includes a control unit which controls the grease supply mechanism to supply the grease to the slide mechanism based on a timing for supplying the grease to the slide mechanism, which is stored in the control unit.

According to one embodiment of the vacuum processing apparatus of the present invention, the slide mechanism is provided in a transfer mechanism which transfers the object to be processed in the vacuum chamber.

According to one embodiment of the vacuum processing apparatus of the present invention, the slide mechanism is constituted of a ball screw and a ball nut included in the transfer mechanism.

A vacuum processing apparatus according to an aspect of the present invention includes: a plurality of vacuum process chambers in each of which vacuum processing is applied to an object to be processed; a vacuum transfer chamber connected to the vacuum process chambers via gate valves; a transfer mechanism transferring the object to be processed in the vacuum transfer chamber and having a grease inlet opening into the vacuum transfer chamber; a grease supply mechanism provided in the vacuum transfer chamber and including a grease storage part and a grease supply port through which grease stored in the grease storage part is supplied; and a control mechanism which moves the transfer mechanism to bring the grease inlet into contact with the grease supply port of the grease supply mechanism, and causes the grease stored in the grease storage part to be supplied to the grease inlet.

According to one embodiment of the vacuum processing apparatus of the present invention, the transfer mechanism includes a ball screw and a ball nut provided in the vacuum transfer chamber, and the grease supplied to the grease inlet is supplied to the ball screw and the ball nut.

According to one embodiment of the vacuum processing apparatus of the present invention, the control mechanism calculates a total driven amount of the transfer mechanism driven by the ball screw and the ball nut and causes the grease to be supplied from the grease supply mechanism when the calculated total driven amount reaches a predetermined value.

According to one embodiment of the vacuum processing apparatus of the present invention, the control mechanism finds the total driven amount by calculating a total driven distance or a total driven time.

According to one embodiment of the vacuum processing apparatus of the present invention, the grease supply mechanism includes: a grease storage part; and a movable cover covering an opening of the grease storage part, sliding while being in contact with an inner wall of the grease storage part, and having a grease supply port, and the cover is pressed and moved toward an inside of the grease storage part by a predetermined distance to cause a predetermined amount of the grease to be supplied through the grease supply port.

According to one embodiment of the vacuum processing apparatus of the present invention, the grease supply mechanism includes: a grease storage part; a movable piston sliding while being in contact with an inner wall of the grease storage part; and a bimetal connected to the piston, and when temperature rises, the bimetal deforms to move the piston, and causes grease in the grease storage part to be supplied.

According to one embodiment of the vacuum processing apparatus of the present invention, the slide mechanism is provided in a transfer mechanism which transfers the object to be processed in the vacuum chamber.

According to one embodiment of the vacuum processing apparatus of the present invention, the slide mechanism is constituted of a ball screw and a ball nut included in the transfer mechanism, and the grease supply mechanism is provided adjacent to the ball nut. Alternatively, the slide mechanism is constituted of a rail and a slider of a linear guide included in the transfer mechanism, and the grease supply mechanism is provided adjacent to a bearing mechanism of the slider.

DESCRIPTION OF THE EMBODIMENTS

Figure 1:
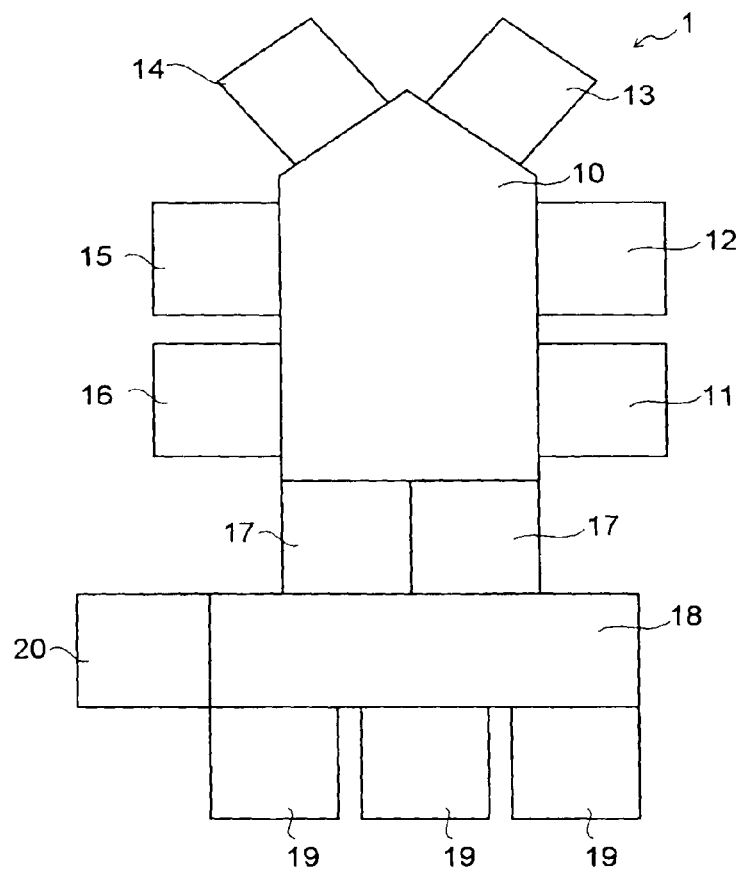
FIG. 1 is a view roughly showing a whole structure of a vacuum processing apparatus according to an embodiment of the present invention.

Hereinafter, an embodiment of the present invention will be described with reference to the drawings. FIG. 1 shows a whole structure of a vacuum processing apparatus according to the embodiment of the present invention. As shown in FIG. 1, a vacuum transfer chamber 10 is provided in a center portion of a vacuum processing apparatus 1. Along the vacuum transfer chamber 10, a plurality of (6 in this embodiment) vacuum process chambers 11 to 16 are arranged to surround the vacuum transfer chamber 10.

In front of (the lower side in FIG. 1) of the vacuum transfer chamber 10, two load lock chambers 17 are provided, and a transfer chamber 18 for transferring a semiconductor wafer W in the atmosphere is provided in front of (the lower side in FIG. 1) of the load lock chambers 17. In front of (the lower side in FIG. 1) of the transfer chamber 18, further provided are a plurality of (3 in FIG. 1) mounting parts 19 on each of which a cassette or a FOUP capable of housing a plurality of semiconductor wafers W is placed. On a side (left side in FIG. 1) of the transfer chamber 18, an aligning mechanism 20 aligning the semiconductor wafer W by an orientation flat or a notch is provided.

Figure 2:
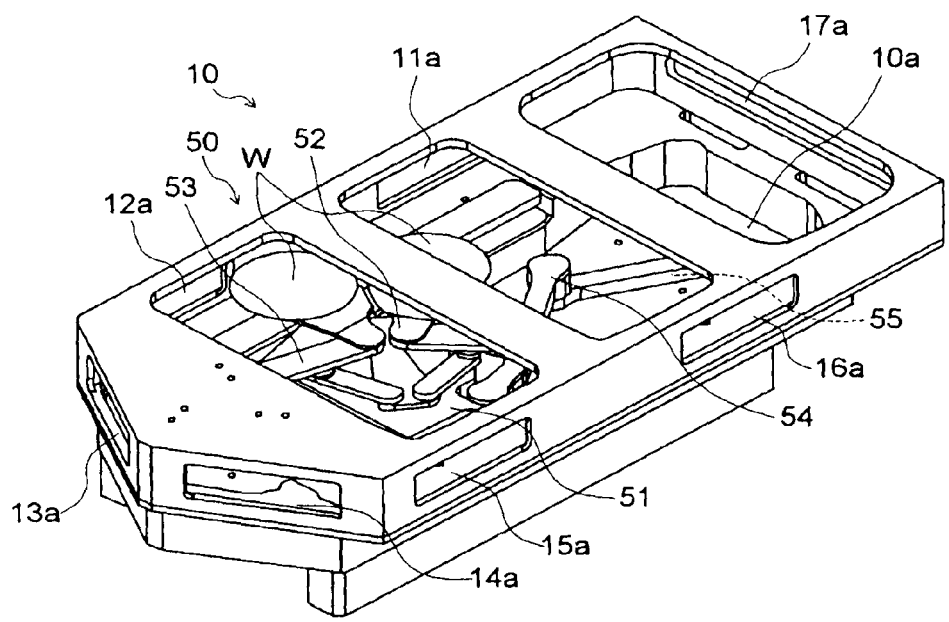
FIG. 2 is a view showing a rough structure of an essential part of the vacuum processing apparatus shown in FIG. 1.

Inside the vacuum transfer chamber 10, a transfer mechanism 50 is disposed as shown in FIG. 2. The transfer mechanism 50 includes a carrier base 51 and two carrier arms 52, 53 rotatably and contractibly/expandably provided on the carrier base 51.

Figure 3:
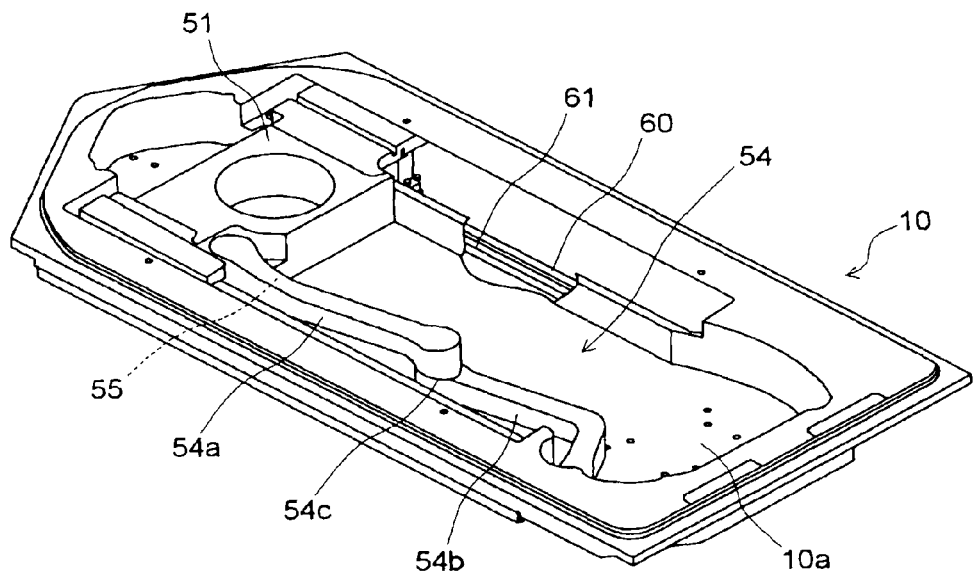
FIG. 3 is a view showing a rough structure of an essential part of the vacuum processing apparatus shown in FIG. 1.
Figure 4:
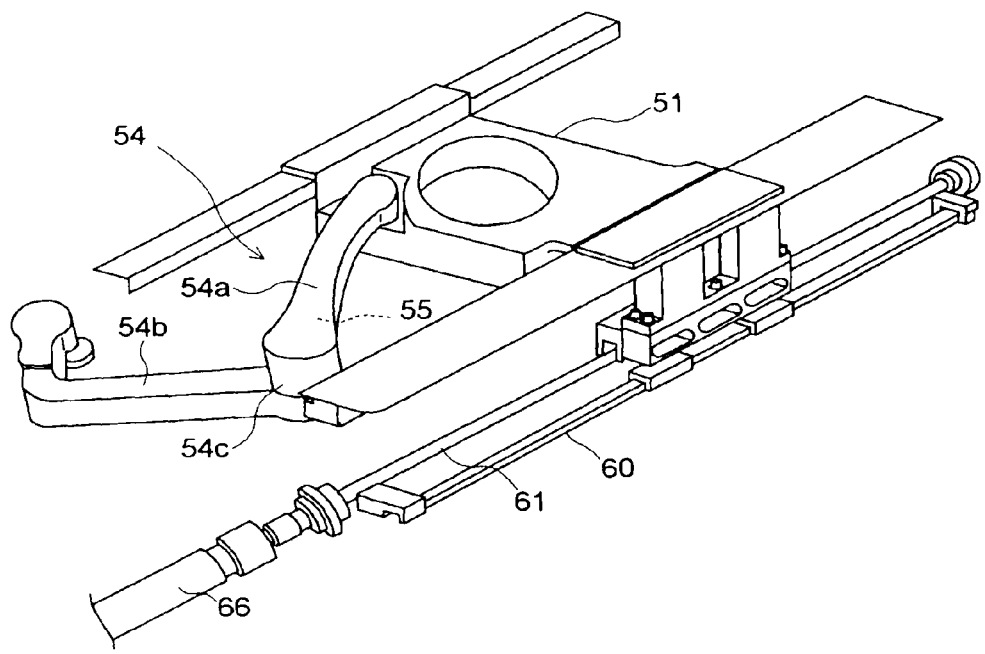
FIG. 4 is a view showing a rough structure of an essential part of the vacuum processing apparatus shown in FIG. 1.

As shown in FIG. 3 and FIG. 4, the carrier base 51 is movable along a longitudinal direction of the vacuum transfer chamber 10 by linear guides 60 and ball screws 61 provided on both sides thereof (only those on one side are shown in FIG. 3 and FIG. 4).

Each of the carrier arms 52, 53 holds one semiconductor wafer W and is capable of carrying the semiconductor wafer W into/out of each of the vacuum process chambers 11 to 16 and the load lock chambers 17 shown in FIG. 1. Note that openings 11a to 16a shown in FIG. 2 are connection portions connected to the vacuum process chambers 11 to 16 respectively via not shown opening/closing mechanisms. Similarly, an opening 17a shown in FIG. 2 is a connection portion connected to the load lock chambers 17 via a not shown opening/closing mechanism.

Further, one end of a duct arm (arm mechanism) 54 bending/stretching according to the movement of the carrier base 51 is connected to the carrier base 51, and the other end of the duct arm 54 is connected to a base member 10a of the vacuum transfer chamber 10. Note that FIG. 3 and FIG. 4 show a state where structures such as the carrier arms 52, 53 on the carrier base 51 are removed for easier understanding of the structure of the carrier base 51 and the duct arm 54.

The duct arm 54 is constituted of a front part 54a and a rear part 54b which are rotatably connected to each other via a joint part 54c, and the connection portion connected to the carrier base 51 and the connection portion connected to the base member 10a are also rotatable. The duct arm 54, which itself does not have any driving source, bends/stretches in accordance with the movement of the carrier base 51. Note that FIG. 3 shows a state where the carrier base 51 has moved to the vacuum process chambers 13, 14 side shown in FIG. 1 and the duct arm 54 is in its most stretched state.

Further, the front part 54a and the rear part 54b of the duct arm 54 are connected to each other, with the front part 54a on an upper side of the rear part 54b, and when the duct arm 54 is in a bent state, the front part 54a is stacked on the upper side of the rear part 54b, so that the duct arm 54 is folded without any interference between the front part 54a and the rear part 54b.

Further, the inside of the duct arm 54 is hollow, and this hollow portion is a cable housing part 55 capable of housing cables and the like and being set to a normal pressure atmosphere. Incidentally, the cables and the like refer to those connecting the inside and the outside of the vacuum transfer chamber 10, for example, electric cables, inlet/exhaust tubes, tubes for temperature regulating medium circulation, and the like. Housing such cables and the like in the cable housing part 55 which is the inside of the duct arm 54 makes it possible to prevent gas or particles generated from the cables and the like from contaminating the inside of the vacuum transfer chamber 10.

Figure 5:
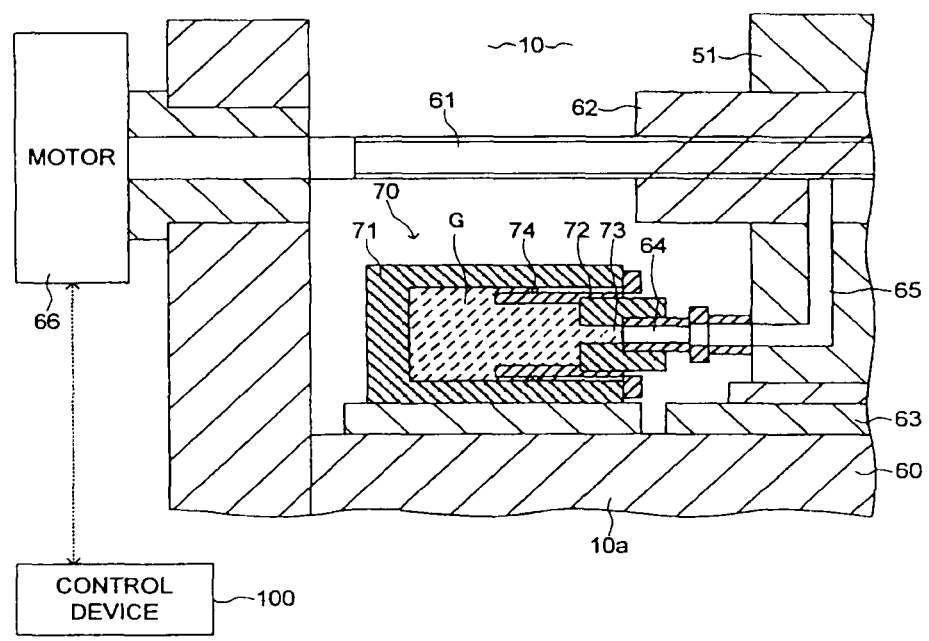
FIG. 5 is a view showing a rough structure of a grease supply mechanism of the vacuum processing apparatus shown in FIG. 1.

As shown in FIG. 5, a grease supply mechanism 70 is disposed in the vacuum transfer chamber 10. The grease supply mechanism 70 is disposed near end portions of the aforesaid linear guide 60 and ball screw 61. The grease supply mechanism 70 is provided on a slider 63 on which the carrier base 51 is placed, and it is capable of supplying grease (vacuum grease) to a portion of a ball nut 62 screwed to the ball screw 61. Incidentally, as the grease (vacuum grease), usable are, for example, fluorinated grease (for example, DEMNUM Grease (trade name: Daikin Industries, Ltd.)) and the like.

The grease supply mechanism 70 includes a cylindrical grease storage part 71 storing grease G therein, and the grease storage part 71 is fixed to the base member 10a of the vacuum transfer chamber 10 by a not-shown screw or the like, with its position being adjustable. The grease storage part 71 has a cover 72 covering an opening of the grease storage part 71.

The cover 72 is movable and slides while being in contact with an inner wall of the grease storage part 71, and has a grease supply port 73 formed near a center portion thereof. Further, an annular sealing member 74 which seals a gap between the cover 72 and an inner wall of the grease storage part 71 is slidably provided around the cover 72 to prevent a large amount of the grease from leaking from a sliding portion.

Meanwhile, the slider 63 for moving the carrier base 51 along the linear guide 60 has a grease inlet 64 which is protrudingly provided so as to be aligned with the grease supply port 73 of the grease supply mechanism 70. The grease inlet 64 communicates with an inner part of the ball nut 62 via a grease path 65. Incidentally, the grease inlet 64 and the aforesaid grease supply port 73 may have an opening/closing mechanism which opens/closes by a resilient force of a spring or the like. In particular, when highly volatile grease is used, it is preferable to provide such an opening/closing mechanism to prevent the evaporation of the grease.

For resupply of the grease, the ball screws 61 are rotated by motors 66 to move the carrier base 51 along the linear guides 60 together with the sliders 63, thereby bringing the grease inlet 64 into contact with the cover 72. Next, the carrier base 51 in this state is further moved toward the cover 72 to press and move the cover 72, so that the grease in the grease storage part 71 is supplied into the grease inlet 64 via the grease supply port 73. At this time, it is possible to control an amount of the supplied grease by a movement distance of the cover 72.

A movement range of the carrier base 51 and the slider 63 in a normal transfer operation is up to such a position that the grease inlet 64 does not come in contact with the cover 72. Therefore, the grease is not supplied in the normal transfer operation.

The grease supply operation using the grease supply mechanism 70 described above is controlled by a control device 100 centrally controlling the entire operations of the vacuum processing apparatus 1. Specifically, the control device 100 controls the driving of the motors 66 to control the movement of the carrier base 51, and executes the aforesaid grease supply operation. In this embodiment, the control device 100 stores a calculated value of the total driven amount of the carrier base 51 (slider 63), and when this calculated value reaches a predetermined value, it executes the aforesaid grease supply operation. This calculated value of the total driven amount can be found based on a calculated value of, for example, a total movement distance of the carrier base 51 (slider 63) corresponding to the number of rotations of the motors 66. Alternatively, a calculated value of a total movement time of the carrier base 51 (slider 63) corresponding to the operating time of the motors 66 may be used. When the calculated value of the total movement distance is adopted, the timing for the grease supply operation may be set, for example, every 10 Km of the movement distance.

Alternatively, the grease supply operation may be executed based on the magnitude of a torque of the motor 66, not based on the aforesaid calculated value of the total movement amount. Specifically, when a large amount of the grease exists between the ball screw 61 and the ball nut 62, the torque of the motor 66 required for rotating the ball screw 61 is somewhat large due to the viscosity of the grease. Then, as the amount of the grease gradually reduces, the torque of the motor 66 required for rotating the ball screw 61 gradually becomes smaller. Therefore, the amount of the grease can be detected based on the magnitude of this torque. In this case, the control device 100 monitors a value of the torque of the motor 66, and an instant at which the value of the torque reduces to a predetermined value or lower is set as the execution timing for the grease supply operation.

The grease supply mechanism 70 as structured above is provided in plurality at places requiring periodic grease supply. For example, the ball screws 61 are provided on both sides of the carrier base 51, and the grease supply mechanisms 70 are provided for the ball screws 61 on the both sides respectively. Further, actually, the ball screw 61 has two screw grooves, and the slider 63 has two ball nuts 62 for one ball screw 61. The grease supply mechanisms 70 are provided for these two ball nuts 62 respectively. Further, the grease supply mechanisms 70 are also provided also for portions between the two linear guides 60 and the two sliders 63 which are provided on both sides of the carrier base 51.

As described above, in the vacuum processing apparatus 1 of this embodiment, it is possible to supply the grease to necessary places by the grease supply mechanisms 70, without opening the vacuum transfer chamber 10 to the atmosphere. This can reduce the work time and trouble conventionally required for the grease supply. This further eliminates a need for the time for setting the vacuum chamber, which has been once made open to the atmosphere, to the vacuum atmosphere again in order to allow the resumption of the vacuum processing. Therefore, it is possible to improve the operating rate of the vacuum processing apparatus to improve productivity. Further, owing to the automatic supply of the grease at preset timings, the maintenance of the grease supply is not forgotten, so that the maintenance of the grease supply can be executed without fail.

Next, operations for the vacuum processing in the vacuum processing apparatus 1 of this embodiment as structured above will be described. When the cassette or the FOUP is placed on the mounting part 19, a not-shown transfer mechanism provided in the transfer chamber 18 takes out the semiconductor wafer W from the cassette or the FOUP, and carries the semiconductor wafer W to the aligning mechanism 20 for alignment, and thereafter, puts the semiconductor wafer W in the load lock chamber 17.

Then, the transfer mechanism 50 carries the semiconductor wafer W from the load lock chamber 17 to each of the vacuum process chambers 11 to 16, where the semiconductor wafer W undergoes predetermined processing. Further, the transfer mechanism 50 carries the semiconductor wafer W, which has undergone the processing, out of each of the vacuum process chambers 11 to 16 to put it in the load lock chamber 17.

The processed semiconductor wafer W thus placed in the load lock chamber 17 is thereafter taken out of the load lock chamber 17 by the transfer mechanism provided in the transfer chamber 18 to be housed in the cassette or the FOUP placed on the mounting part 19.

In executing the vacuum processing as described above, the carrier base 51 is linearly driven in the vacuum transfer chamber 10 which is set to the vacuum atmosphere. The above-described control device 100 calculates the total driven amount of the carrier base 51 to store the calculated value. Then, when the calculated value of the total driven amount reaches the predetermined value, the aforesaid grease supply operation by the grease supply mechanism 70 is executed.

As described above, according to the vacuum processing apparatus of this embodiment, it is possible to supply the grease to predetermined places, without opening the vacuum chamber to the atmosphere, so that the operating rate of the vacuum processing apparatus can be improved, leading to improved productivity, and it is possible to execute the maintenance of the grease supply without fail.

Figure 6:
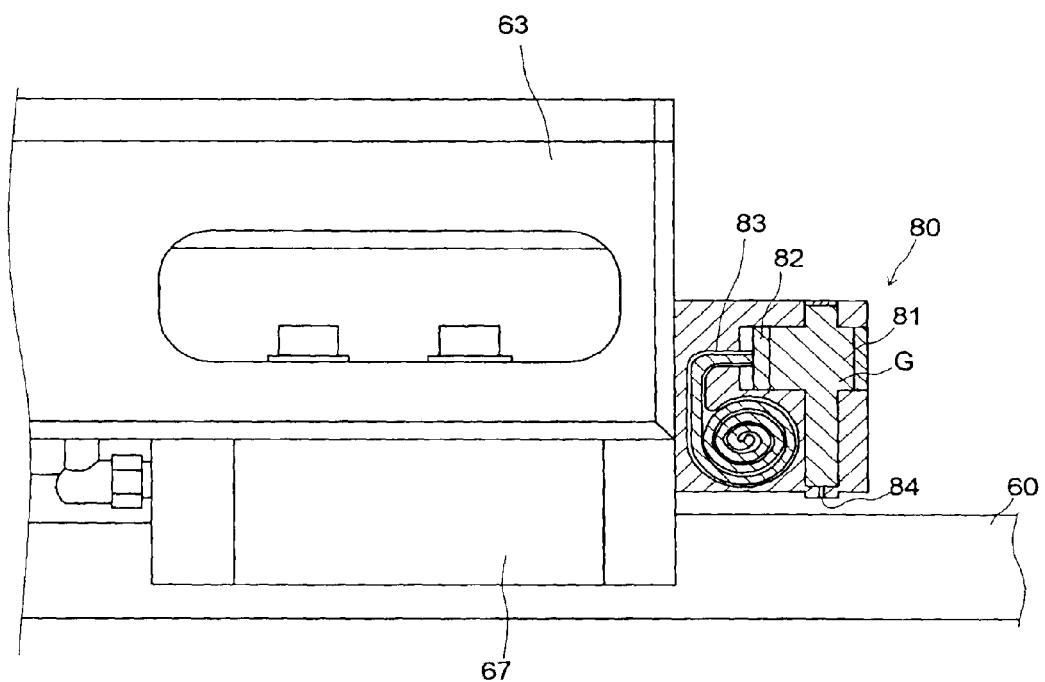
FIG. 6 is a view showing a rough structure of another grease supply mechanism.
Figure 7A:
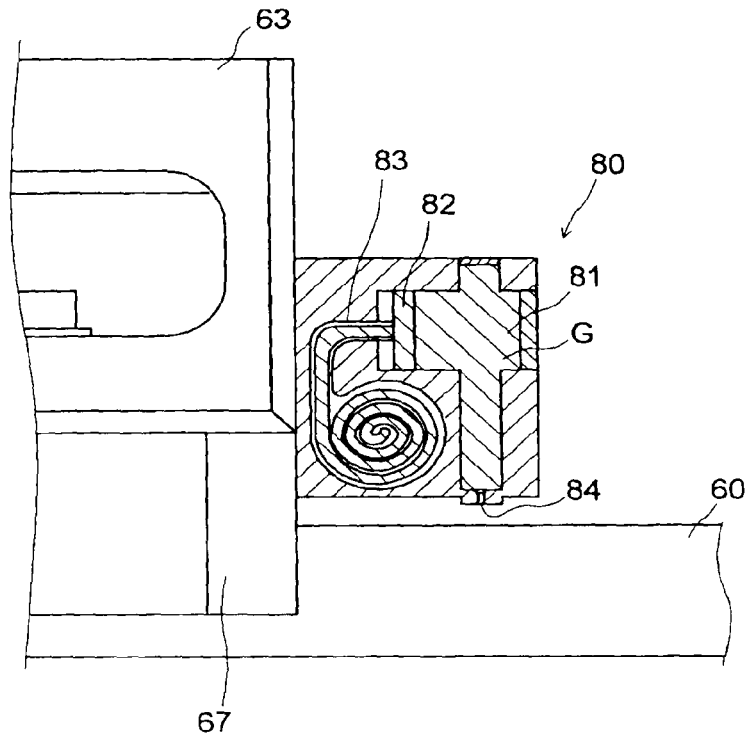
FIG. 7A is a view showing the grease supply mechanism shown in FIG. 6 at room temperature.
Figure 7B:
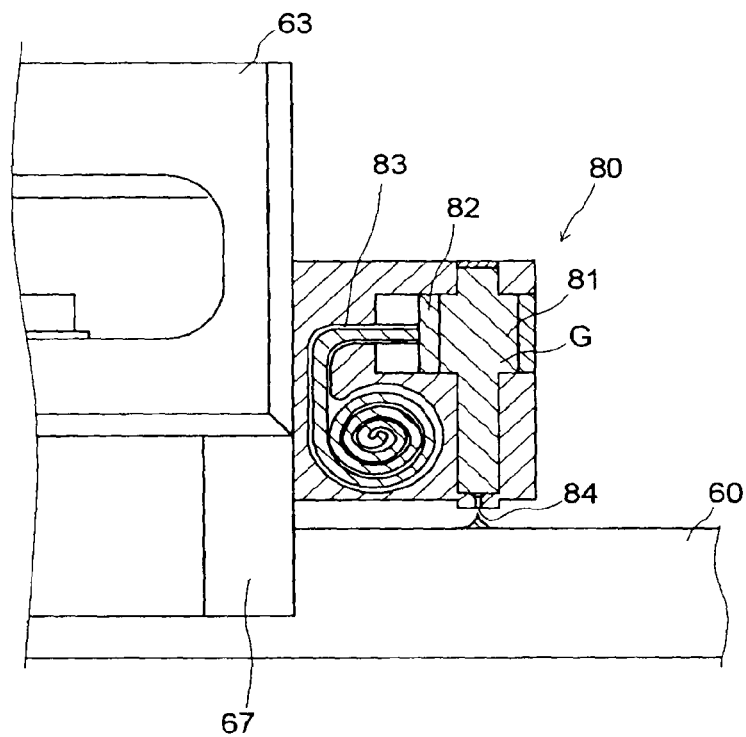
FIG. 7B is a view showing the same at high temperature.

Next, another grease supply mechanism 80 will be described with reference to FIG. 6 and FIGS. 7A and 7B. The grease supply mechanism 80 includes a cylindrical grease storage part 81 storing grease G. In a back end side of the grease storage part 81, provided is a piston 82 which moves while being in contact with an inner wall of the grease storage part 81. The piston 82 is connected to a bimetal 83 and moves in the grease storage part 81 in the right and left direction in the drawings in accordance with the deformation of the bimetal 83. The grease storage part 81 has on a lower side thereof a grease supply port 84. The bimetal 83 is formed in, for example, a spiral shape. However, the bimetal 83 may have any shape as long as it can move the piston 82 when its temperature rises.

When the bimetal 83 deforms in accordance with the temperature rise, the piston 82 is pressed by the bimetal 83 to move toward the right side in the drawings, so that the grease G is pushed out of the grease supply port 84. FIG. 7A shows a state at room temperature, and FIG. 7B shows a state where the grease G is pushed out of the grease supply port 84 due to the temperature rise.

The grease supply mechanism 80 is mounted adjacent to, for example, a bearing mechanism 67 of the slider 63 moving along the linear guide (rail) 60. The grease supply port 84 of the grease supply mechanism 80 faces the linear guide 60. Therefore, when, in accordance with the movement of the slider 63 along the linear guide 60, frictional heat is generated due to the insufficient grease to raise the temperature (for example, 50° C. to 60° C.) of the bearing mechanism 67, the heat is transferred to the grease supply mechanism 80, so that the grease is supplied to the linear guide 60 from the grease supply mechanism 80. In this manner, when the grease becomes insufficient, the grease is automatically supplied to the linear guide 60 from the grease supply mechanism 80. Further, the grease supply mechanism 80 can be mounted so as to supply the grease to a sliding portion between the ball screw 61 and the ball nut 62. In this case, the grease supply mechanism is preferably disposed near the ball nut 62. Consequently, when the frictional heat is generated due to the insufficient grease to raise the temperature (for example, 50° C. to 60° C.) of the ball nut 62 as the ball screw 61 rotates and slides against the ball nut 62, the heat is transferred to the grease supply mechanism 80, so that the grease is supplied to the ball screw 61 and the ball nut 62 from the grease supply mechanism 80.

The above-described embodiment includes the grease supply mechanism supplying the grease to the slide mechanism which is a linear driving portion of the transfer mechanism, but it should be noted that the present invention is not limited to such an embodiment. It goes without saying that the present invention is similarly applicable to other slide mechanisms. Further, the structure of the grease supply mechanism is not limited to that shown in FIG. 5 or in FIG. 6 and FIGS. 7A and 7B. The grease supply mechanism may have any structure as long as it can store the grease and can supply the stored grease. Further, a similar grease supply mechanism can also be provided for a slide mechanism outside the vacuum chamber.

What is claimed is:

1. A vacuum processing apparatus applying vacuum processing to an object to be processed under a vacuum atmosphere, comprising:
    a vacuum chamber; and
    a grease supply mechanism provided in said vacuum chamber to supply grease to a slide mechanism sliding in said vacuum chamber,
    wherein said grease supply mechanism, comprising:
        a grease storage part;
        a movable piston sliding while being in contact with an inner wall of the grease storage part; and
        a bimetal connected to the piston, and
    wherein, when temperature rises, the bimetal deforms to move the piston, and causes grease in the grease storage part to be supplied.

2. The vacuum processing apparatus as set forth in claim 1, wherein the slide mechanism is provided in a transfer mechanism which transfers the object to be processed in said vacuum chamber.

3. The vacuum processing apparatus as set forth in claim 2, wherein the slide mechanism is constituted of a ball screw and a ball nut included in the transfer mechanism, and
    wherein said grease supply mechanism is provided adjacent to the ball nut.

4. The vacuum processing apparatus as set forth in claim 2, wherein the slide mechanism is constituted of a rail and a slider of a linear guide included in the transfer mechanism, and
    wherein said grease supply mechanism is provided adjacent to a bearing mechanism of the slider.

* * * * *